(12) United States Patent
McChesney et al.

(10) Patent No.: US 9,679,751 B2
(45) Date of Patent: Jun. 13, 2017

(54) CHAMBER FILLER KIT FOR PLASMA ETCH CHAMBER USEFUL FOR FAST GAS SWITCHING

(75) Inventors: Jon McChesney, Sacramento, CA (US); Theo Panagopoulos, San Jose, CA (US); Alex Paterson, San Jose, CA (US); Craig Blair, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 820 days.

(21) Appl. No.: 13/421,188

(22) Filed: Mar. 15, 2012

(65) Prior Publication Data
US 2013/0244440 A1 Sep. 19, 2013

(51) Int. Cl.
*C23C 16/44* (2006.01)
*H01J 37/32* (2006.01)
*H01L 21/3065* (2006.01)

(52) U.S. Cl.
CPC .... *H01J 37/32477* (2013.01); *C23C 16/4404* (2013.01); *H01J 37/321* (2013.01); *H01J 37/32458* (2013.01); *H01L 21/30655* (2013.01)

(58) Field of Classification Search
CPC ............ C23C 16/4404; C23C 16/4412; C23C 16/45591; H01J 37/321; H01J 37/32458; H01J 37/32477; H01J 37/32495; H01J 37/32871; H01J 2237/0268; H01L 21/30655; H05H 2001/4652
USPC ......... 118/715, 728–729; 156/345.1, 345.51, 156/345.54
See application file for complete search history.

(56) References Cited

U.S. PATENT DOCUMENTS

| 5,188,672 | A | * | 2/1993 | Rinnovatore ................. 118/715 |
| 5,391,260 | A | | 2/1995 | Makino et al. |
| 5,501,893 | A | | 3/1996 | Laermer et al. |
| 5,544,618 | A | | 8/1996 | Stall et al. |
| 5,605,637 | A | | 2/1997 | Shan et al. |
| 5,685,942 | A | | 11/1997 | Ishii |
| 6,013,155 | A | | 1/2000 | McMillin et al. |

(Continued)

FOREIGN PATENT DOCUMENTS

WO WO 2004/012229 A2 2/2004

OTHER PUBLICATIONS

International Search Report and Written Opinion mailed May 13, 2013 for PCT/US13/28491.

*Primary Examiner* — Gordon R Baldwin
*Assistant Examiner* — Benjamin Kendall

(57) ABSTRACT

A chamber filler kit for an inductively coupled plasma processing chamber in which semiconductor substrates are processed by inductively coupling RF energy through a window facing a substrate supported on a cantilever chuck. The kit includes at least one chamber filler which reduces the lower chamber volume in the chamber below the chuck. The fillers of the kit can be mounted in a standard chamber having a chamber volume of over 60 liters and by using different sized chamber fillers it is possible to reduce the chamber volume to provide desired gas flow conductance and accommodate changes in vacuum pressure during processing of the substrate. The chamber filler kit can be used to modify a standard chamber to accommodate different processing regimes such as rapid alternating processes wherein wide pressure changes are needed without varying a gap between the substrate and the window.

11 Claims, 7 Drawing Sheets

(56) References Cited

U.S. PATENT DOCUMENTS

| | | |
|---|---|---|
| 6,051,100 A | 4/2000 | Walko, II |
| 6,178,918 B1 | 1/2001 | van Os et al. |
| 6,270,862 B1 | 8/2001 | McMillin et al. |
| 6,357,385 B1 | 3/2002 | Ohmi et al. |
| 6,402,848 B1* | 6/2002 | Horiguchi ............ C23C 16/405 118/715 |
| 6,408,786 B1* | 6/2002 | Kennedy et al. ...... 118/723 AN |
| 6,422,825 B2* | 7/2002 | Dandl et al. ................. 417/48 |
| 6,527,911 B1* | 3/2003 | Yen et al. ................ 156/345.43 |
| 6,623,596 B1 | 9/2003 | Collins et al. |
| 6,634,845 B1 | 10/2003 | Komino |
| 6,797,639 B2 | 9/2004 | Carducci et al. |
| 6,833,325 B2 | 12/2004 | Huang et al. |
| 6,852,167 B2 | 2/2005 | Ahn |
| 6,916,746 B1 | 7/2005 | Hudson et al. |
| 6,924,235 B2 | 8/2005 | Johnson et al. |
| 7,011,039 B1 | 3/2006 | Mohn et al. |
| 7,166,233 B2 | 1/2007 | Johnson et al. |
| 7,234,412 B2* | 6/2007 | Carpenter et al. ........ 118/723 R |
| 7,294,580 B2 | 11/2007 | Yun et al. |
| 7,459,100 B2 | 12/2008 | Kiermasz et al. |
| 7,472,581 B2 | 1/2009 | Kitazawa et al. |
| 7,520,957 B2 | 4/2009 | Kao et al. |
| 7,578,258 B2 | 8/2009 | Fischer |
| 7,618,548 B2 | 11/2009 | Chinn et al. |
| 7,674,351 B2 | 3/2010 | Makino et al. |
| 7,708,859 B2 | 5/2010 | Huang et al. |
| 7,749,914 B2 | 7/2010 | Honda et al. |
| 7,785,417 B2 | 8/2010 | Ni et al. |
| 7,824,519 B2* | 11/2010 | Wang et al. ................ 156/345.1 |
| 7,828,928 B2 | 11/2010 | Makino et al. |
| 7,833,382 B2 | 11/2010 | Makino et al. |
| 7,837,825 B2 | 11/2010 | Fischer |
| 7,938,906 B2 | 5/2011 | Wen |
| 8,088,248 B2 | 1/2012 | Larson |
| 8,198,567 B2* | 6/2012 | Lerner ................. B25B 11/005 118/728 |
| 2003/0070620 A1 | 4/2003 | Cooperberg et al. |
| 2003/0213560 A1 | 11/2003 | Wang et al. |
| 2004/0134427 A1* | 7/2004 | Derderian et al. ............ 118/715 |
| 2006/0065635 A1 | 3/2006 | Derderian et al. |
| 2006/0162656 A1 | 7/2006 | Fink |
| 2006/0196420 A1 | 9/2006 | Ushakov et al. |
| 2007/0066038 A1 | 3/2007 | Sadjadi et al. |
| 2008/0251019 A1 | 10/2008 | Krishnaswami et al. |
| 2009/0242512 A1 | 10/2009 | Beaudry |
| 2009/0272717 A1 | 11/2009 | Pamarthy et al. |
| 2009/0325386 A1 | 12/2009 | Devine et al. |
| 2010/0140223 A1 | 6/2010 | Tyler et al. |
| 2010/0186672 A1* | 7/2010 | Okuda ................ C23C 16/4586 118/723 R |
| 2010/0197138 A1 | 8/2010 | Cheshire et al. |
| 2011/0023779 A1* | 2/2011 | Wang et al. ................. 118/667 |
| 2011/0198417 A1* | 8/2011 | Detmar ................ H01J 37/321 239/569 |
| 2011/0244686 A1 | 10/2011 | Aso et al. |

* cited by examiner

CHAMBER FILLER KIT FOR PLASMA ETCH CHAMBER USEFUL FOR FAST GAS SWITCHING

BACKGROUND

The Bosch process is a plasma etch process that has been widely used to fabricate deep vertical (high aspect ratio) features (with depth such as tens to hundreds of micrometers), such as trenches and vias, in the semiconductor industry. The Bosch process comprises cycles of alternating etching steps and deposition steps. Details of the Bosch process can be found in U.S. Pat. No. 5,501,893, which is hereby incorporated by reference. The Bosch process can be carried out in a plasma processing apparatus configured with a high-density plasma source, such as an inductively coupled plasma (ICP) source, in conjunction with a radio frequency (RF) biased substrate electrode. Process gases used in the Bosch process for etching silicon can be sulfur hexafluoride ($SF_6$) in an etching step and octofluorocyclobutane ($C_4F_8$) in a deposition step. The process gas used in the etching step and the process gas used in the deposition step are respectively referred to as "etch gas" and "deposition gas" hereinbelow. During an etching step, $SF_6$ facilitates spontaneous and isotropic etching of silicon (Si); during a deposition step, $C_4F_8$ facilitates the deposition of a protective polymer layer onto sidewalls as well as bottoms of the etched structures. The Bosch process cyclically alternates between etch and deposition steps enabling deep structures to be defined into a masked silicon substrate. Upon energetic and directional ion bombardment, which is present in the etching steps, any polymer film coated in the bottoms of etched structures from the previous deposition step will be removed to expose the silicon surface for further etching. The polymer film on the sidewall will remain because it is not subjected to direct ion bombardment, thereby, inhibiting lateral etching.

One limitation of the Bosch process is roughened sidewalls of etched deep features. This limitation is due to the periodic etch/deposition scheme used in the Bosch process and is known in the art as sidewall "scalloping". For many device applications, it is desirable to minimize this sidewall roughness or scalloping. The extent of scalloping is typically measured as a scallop length and depth. The scallop length is the peak-to-peak distance of the sidewall roughness and is directly correlated to the etch depth achieved during a single etch cycle. The scallop depth is the peak to valley distance of sidewall roughness and is correlated to the degree of anisotropy of an individual etching step. The extent of scallop formation can be minimized by shortening the duration of each etch/deposition step (i.e. shorter etch/deposition steps repeated at a higher frequency).

In addition to smoother feature sidewalls it is also desirable to achieve a higher overall etch rate. The overall etch rate is defined as a total depth etched in a process divided by a total duration of the process. The overall etch rate can be increased by increasing efficiency within a process step (i.e. decreasing dead time).

In a conventional plasma processing apparatus, a substrate is supported on a substrate support in a processing chamber and the substrate can be a semiconductor wafer having diameters such as 4", 6", 8", 12", etc. The substrate support may comprise, for example, a radio frequency (RF) powered electrode supported from a lower endwall of the chamber or may be cantilevered, e.g., extending from a sidewall of the chamber. The substrate may be clamped to the electrode either mechanically or electrostatically. The substrate is processed in the processing chamber by energizing a process gas in the processing chamber into a high density plasma. A source of energy maintains a high density (e.g., $10^{11}$-$10^{12}$ ions/cm$^3$) plasma in the chamber, for example, an antenna, such as the planar multiturn spiral coil or an antenna having another shape, powered by a suitable RF source and suitable RF impedance matching circuitry inductively couples RF energy into the chamber to generate a high density plasma. The RF power applied to the antenna can be varied according to different process gases used in the chamber (e.g. etch gas containing $SF_6$ and deposition gas containing $C_4F_8$). The chamber may include a suitable vacuum pumping apparatus for maintaining the interior of the chamber at a desired pressure (e.g., below 5 Torr, preferably 1-100 mTorr). A dielectric window, such as the planar dielectric window of uniform thickness or a non-planar dielectric window (not shown) is provided between the antenna and the interior of the processing chamber and forms a vacuum wall at the top of the processing chamber. A gas delivery system can be used to supply process gases into the chamber. Details of such a plasma processing apparatus are disclosed in commonly-owned U.S. Patent Application Publication Nos. 2001/0010257, 2003/0070620, U.S. Pat. No. 6,013,155, or U.S. Pat. No. 6,270,862, each of which is incorporated herein by reference in its entirety.

Gas delivery systems designed for fast gas switching are disclosed in commonly-owned U.S. Pat. Nos. 7,459,100 and 7,708,859 and U.S. Patent Publication Nos. 2007/0158025 and 2007/0066038, the disclosures of which are hereby incorporated by reference.

The substrate preferably comprises a silicon material such as a silicon wafer and/or polysilicon. Various features such as holes, vias and/or trenches are to be etched into the silicon material. A patterned masking layer (e.g. photoresist, silicon oxide, and/or silicon nitride) having an opening pattern for etching desired features is disposed on the substrate.

U.S. Patent Publication No. 2009/0242512 discloses an example of a multi-step Bosch type process in which the chamber pressure is at 35 mTorr for 5 seconds during deposition of a passivation film, 20 mTorr for 1.5 seconds during a low pressure etch step and 325 mTorr for 7.5 seconds during a high pressure etch step (see Table 4.2.1) or 35 mTorr for 5 seconds during deposition, 20 mTorr for 1.5 seconds during low pressure etch, 325 mTorr for 7.5 seconds during high pressure etch and 15 mTorr for 1 second during low pressure etch (see Table 4.2.2). Commonly-assigned U.S. Patent Publication 2011/0244686 discloses a process of etching silicon vias (TSVs) and silicon deep trenches using a 2300 Syndion™ plasma processing system to perform a gas modulated cyclical etch step.

Variation in chamber pressure is desired in other processes such as atomic layer deposition, plasma enhanced CVD, multi-step processes of plasma etching openings in mask material and removal of the mask material, multi-step plasma etch processes wherein the concentration of etchant gas is periodically varied or different layers of material are sequentially etched. To reduce the overall processing time, reduction in the transition period between high and low pressure phases of such cyclical processes would be desirable. For instance, U.S. Patent Publication No. 2009/0325386 discloses a conductance limiting element for rapid adjustment of pressure in a low volume vacuum chamber on the order of tens of milliseconds. The '386 publication states that during processing, a single chemical species can be flowed in the processing region during multiple pressure cycles or different chemical species can be introduced during multiple pressure cycles with the time at high or low pressure ranging from 0.1 to 2 seconds.

A limitation of using inductively coupled plasma chambers for rapid alternating processing is that the chamber volume is large and changes in chamber pressure cannot be effected rapidly due to the large chamber volume. Further, it would be desirable to tailor a chamber to a particular processing regime wherein chamber volume and conductance can be varied to achieve desired chamber pressures and gas switching rates.

SUMMARY

Described herein is a chamber filler kit which comprises at least one chamber filler configured to be replaceably mounted in an inductively coupled plasma chamber having a vacuum outlet in a bottom wall and a cantilever chuck supported on a sidewall of the chamber. The at least one chamber filler is configured to provide a preselected lower chamber volume and conductance enabling a particular process to be carried out in the plasma chamber. The at least one chamber filler preferably includes a horizontally extending side opening which fits around a horizontal arm of the cantilever chuck and an inner frustoconical surface which is separated from an outer surface of the chuck by a clearance gap.

In a preferred embodiment, the chamber filler kit includes a top filler, a mid filler and a bottom filler. The top filler has an outer wall configured to fit against the sidewall of the chamber, a frustoconical inner wall, the side opening extending from the inner wall to the outer wall, a horizontally extending upper end, and a horizontally extending lower end. The mid filler has an outer wall configured to fit against the sidewall of the chamber, an inner wall comprising a horizontally extending annular section extending between an upper concave section and a lower convex section, a horizontally extending upper end and a horizontally extending lower end, the upper end of the mid filler having the same cross section as the lower end of the top filler such that the inner surface of the mid filler mates with the inner surface of the top filler and the outer wall of the mid filler mates with the outer wall of the top filler. The bottom filler has an outer wall configured to fit against a bottom wall of the chamber, a cylindrical inner wall, a horizontally extending upper end and a horizontally extending lower end, the upper end of the bottom filler having the same cross section as the lower end of the mid filler such that the inner wall of the bottom filler mates with the inner wall of the mid filler and the outer wall of the bottom filler mates with the outer wall of the mid filler.

In a preferred method of processing a substrate in a chamber containing the chamber filler kit, the method includes supporting a semiconductor substrate on the chuck, supplying process gas to the interior of the chamber, and energizing the process gas into a plasma state and processing the semiconductor substrate with the plasma. The plasma processing can comprise plasma etching wherein the plasma processing comprises rapid alternating cycles of supplying etch gas into the chamber, energizing the etch gas into a plasma state and etching features into the semiconductor substrate followed by supplying deposition gas into the chamber, energizing the deposition gas into a plasma state and depositing passivating material on the etched features.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Described herein is an inductively coupled plasma processing chamber in which rapid pressure changes can be achieved during rapid alternating processing. For example, deep features of semiconductor substrates can be processed by rapid alternating phases of etching and passivation (deposition of a protective layer of material) at different chamber pressures. The plasma processing chamber includes chamber fillers which reduce the chamber volume of the chamber below the chuck supporting the substrate to minimize the time in which pressure can be changed in the plasma processing chamber. One limitation of the Bosch process is roughened sidewalls of etched deep features. This limitation is due to the periodic etch/deposition scheme used in the Bosch process and is known in the art as sidewall "scalloping". For many device applications, it is desirable to minimize this sidewall roughness or scalloping. The extent of scalloping is typically measured as a scallop length and depth. The scallop length is the peak-to-peak distance of the sidewall roughness and is directly correlated to the etch depth achieved during a single etch cycle. The scallop depth is the peak to valley distance of sidewall roughness and is correlated to the degree of anisotropy of an individual etching step. The extent of scallop formation can be minimized by shortening the duration of each etch/deposition step (i.e. shorter etch/deposition steps repeated at a higher frequency).

Figure 1:
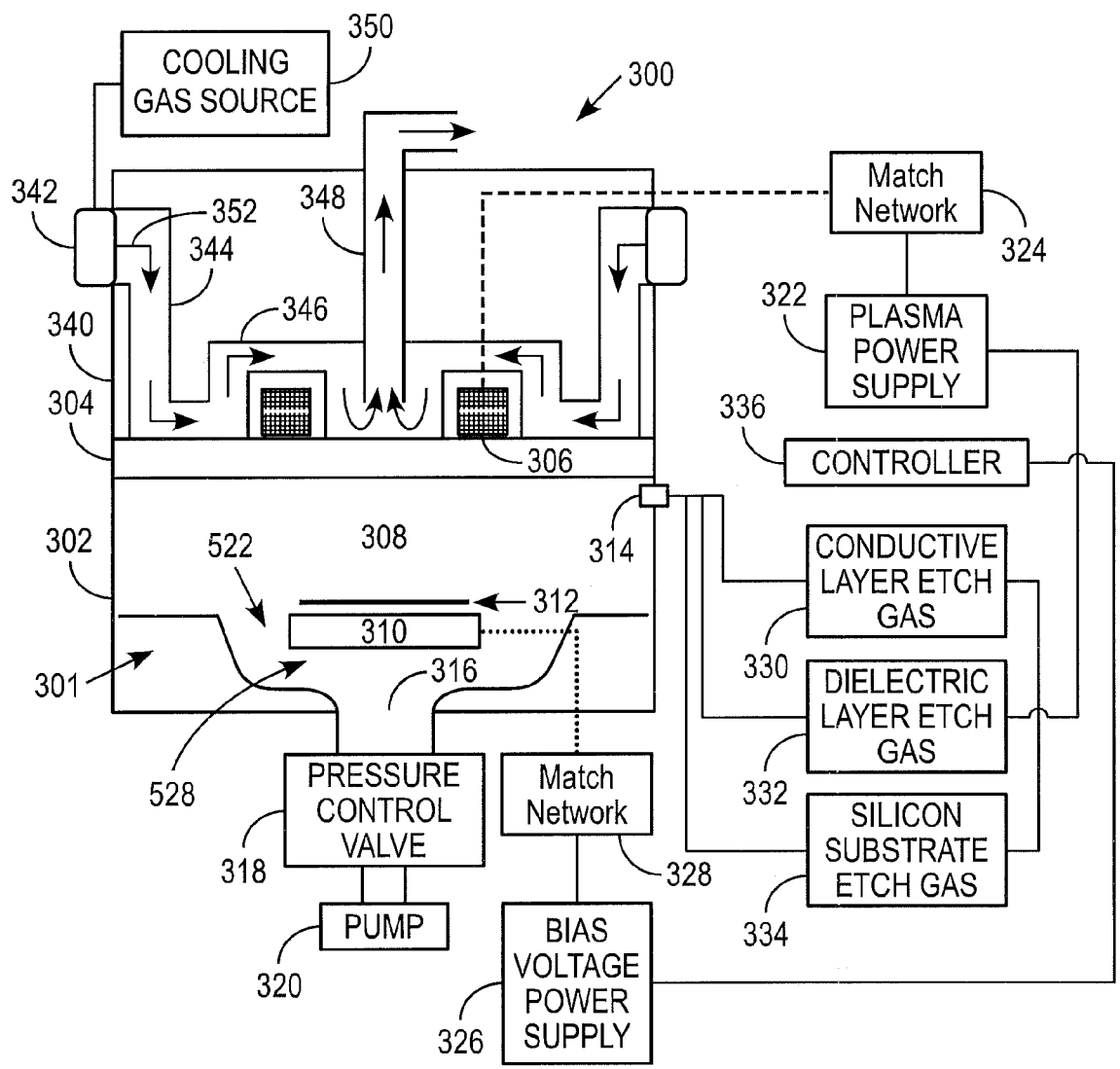
FIG. 1 shows an exemplary plasma processing chamber having a chamber filler kit for reducing the lower chamber volume as described herein.

FIG. 1 shows a schematic view of a plasma processing system 300 including a plasma chamber 302 having a chamber filler 301 therein which reduces the lower chamber volume. A plasma power supply 322, tuned by a match network 324 supplies power to an antenna 306 located near a window 304 to create a plasma 308 in a gap between the window 304 and a substrate 312 supported on a cantilever chuck 310. Antenna 306 may be configured to produce a uniform diffusion profile within processing chamber 302; for example, antenna 306 may be configured for a toroidal power distribution in plasma 308. Window 304 is provided between the antenna 306 and the interior of the plasma chamber 302 and is made of a dielectric material which allows RF energy to pass from antenna 306 to plasma chamber 302. A wafer bias voltage power supply 326 tuned by a match network 328 provides power to an electrode in the cantilever chuck 310 to set the bias voltage on wafer 312, which is supported by chuck 310. Set points for plasma power supply 322 and wafer bias voltage power supply 326 are set by controller 336. The chamber 302 includes an outlet port 316 connected to a pumping apparatus 320, and pressure control valve assembly 318, which control the interior of pressure of chamber 302.

Process gases are supplied into the chamber by gas distribution member 314 which can be a gas ring, one or more gas injectors located on the side wall or top wall of the chamber, showerhead located below the window 304, or other suitable gas distribution apparatus. The gas distribution member receives gas from gas sources such as conductive layer gas etchant 330, dielectric layer gas etchant 332, silicon substrate gas etchant 334, deposition gas (not shown) or other gas sources depending on the process to be carried out in the chamber 302. The antenna 306 is contained in a cooling system 340 which includes a cooling gas inlet 342 which receives cooling gas from cooling gas source 350, gas delivery conduit 344, gas manifold 346 surrounding the antenna 306, and gas removal conduit 348.

Figure 2:
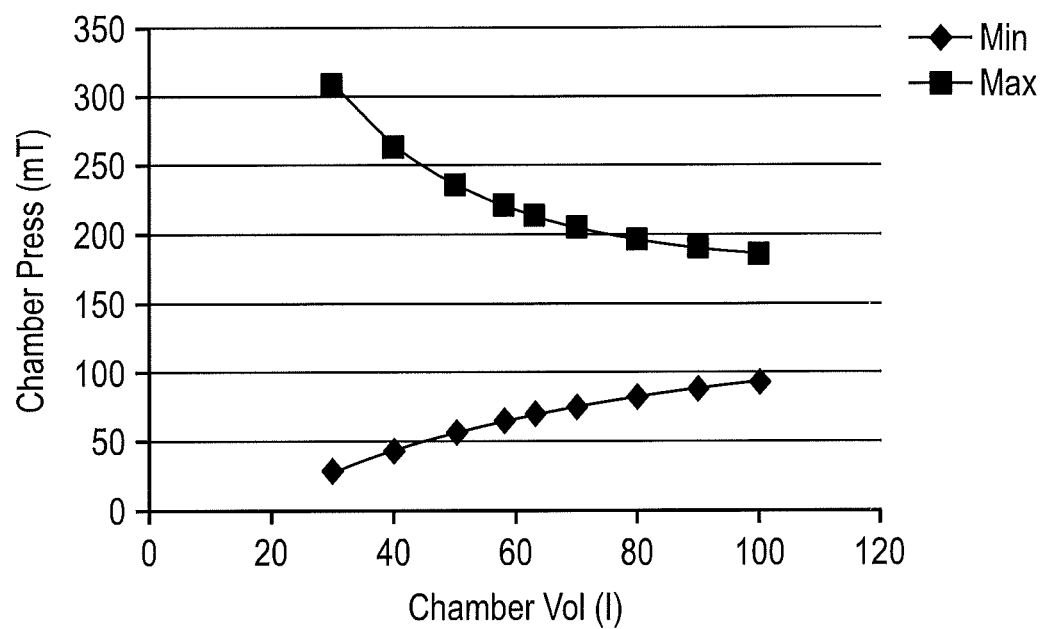
FIG. 2 shows a graph of the effect of chamber volume on gas pressure during rapid alternating processing.

FIG. 2 shows a graph of chamber pressure versus chamber volume. As can be seen in FIG. 2, large volume chambers cannot achieve wide variation in chamber pressures. For example, for a 100 liter chamber, the maximum pressure that can be attained is under 200 mTorr and the minimum pressure is close to 100 mTorr. In contrast, a chamber with a chamber volume of 40 liters can attain maximum pressures of over 300 mTorr and minimum pressures of under 50 mTorr. As described herein, a chamber filler kit 301 comprising at least one chamber filler can be used to reduce lower chamber volume below the cantilevered chuck. Preferably the at least one chamber filler includes a top chamber filler, a mid chamber filler and a bottom chamber filler which mate with inner surfaces of an inductively coupled plasma chamber. The top chamber filler includes a horizontally extending side opening which fits around a horizontal arm of a cantilever chuck 310. The inner wall of the top chamber filler is inclined (frustoconical) to provide a clearance gap between the inner wall of the top chamber filler and the outer surface of the chuck body. Preferably, the clearance gap is between 1 and 2 inches, more preferably about 1.5 inches. However, different sets of the chamber fillers can be configured to provide different lower chamber volumes in an inductively coupled plasma chamber having a chamber volume of over 60 liters, e.g., 90 to 100 liter chambers which do not contain chamber fillers. For example, the chamber fillers can be provided in sets which reduce the lower chamber volume such that the total chamber volume can be set to any desired chamber volume in the range of 20 to 60 liters. With the chamber fillers, a standard chamber can be quickly adapted to tailor the chamber volume to a particular process being run in the chamber by removing one set of chamber fillers and inserting a different set of chamber fillers.

Figure 3:
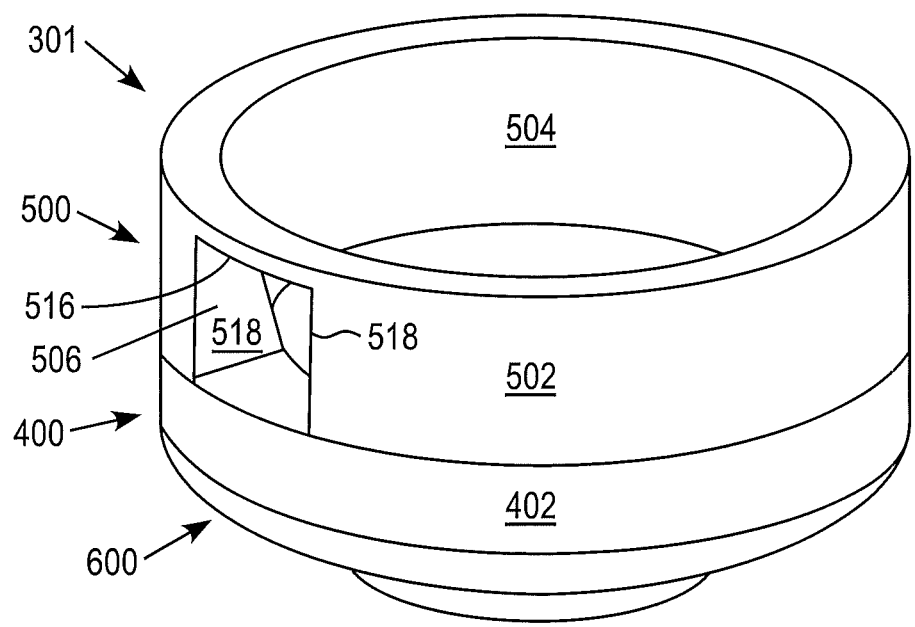
FIG. 3 shows a chamber filler kit comprising a top filler, a mid filler and a bottom filler assembled outside a chamber.
Figure 4:
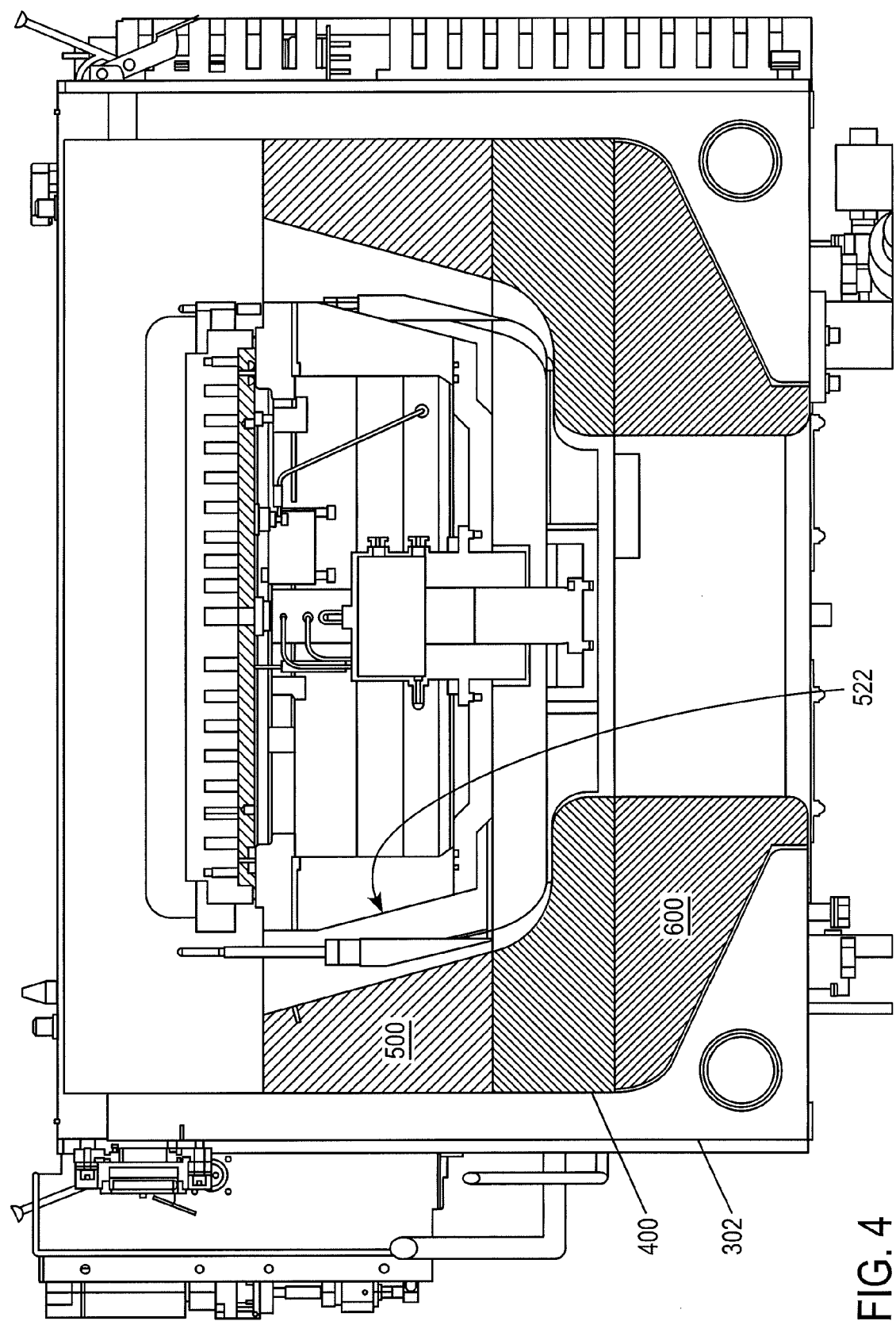
FIG. 4 shows a cross section of a plasma chamber containing the chamber fillers shown in FIG. 3.
Figure 5A:
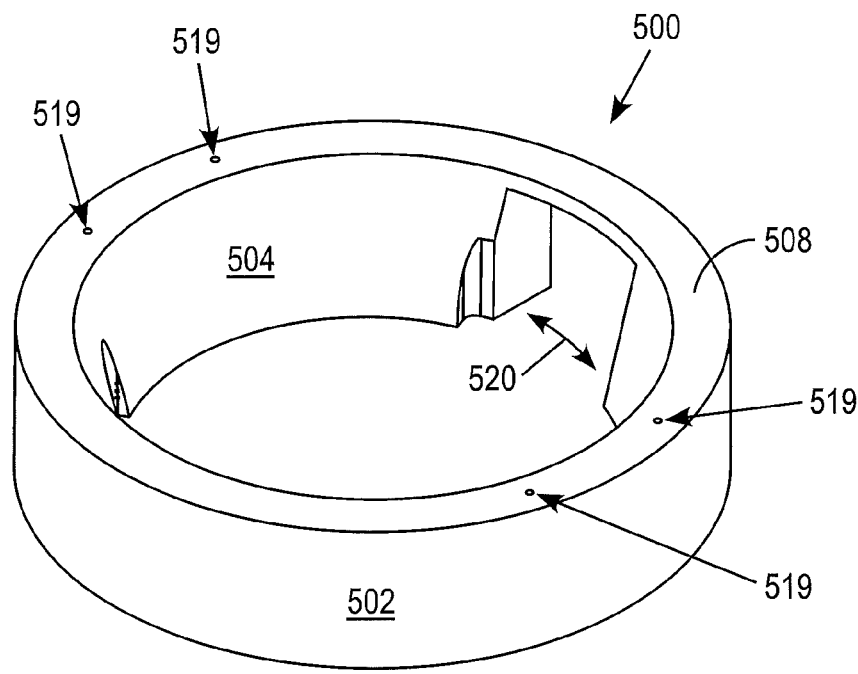
FIG. 5A is a perspective top view of the top filler shown in FIG. 3
Figure 5B:
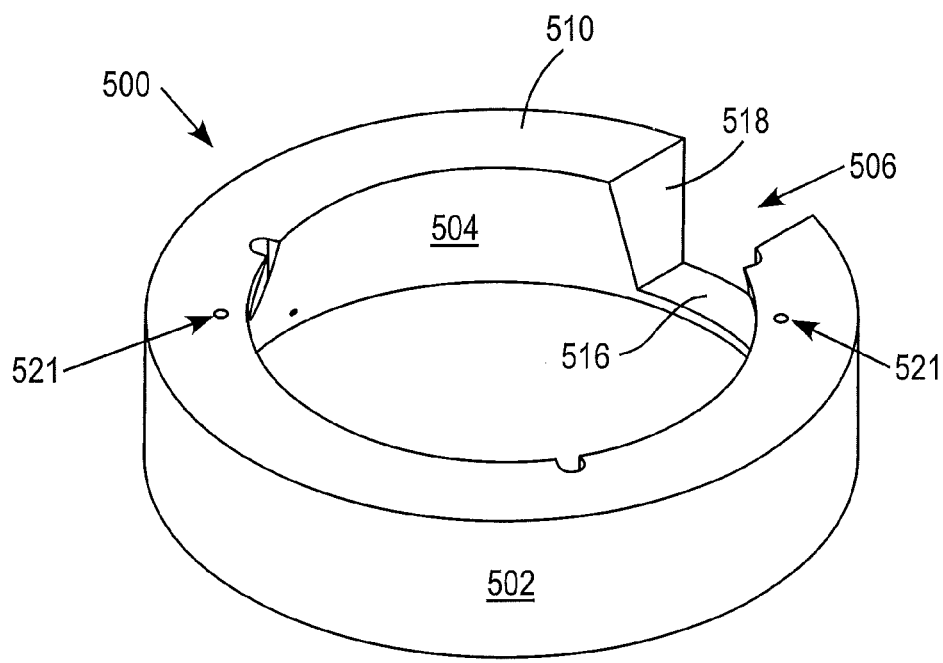
FIG. 5B is a perspective bottom view of the top filler.
Figure 6A:
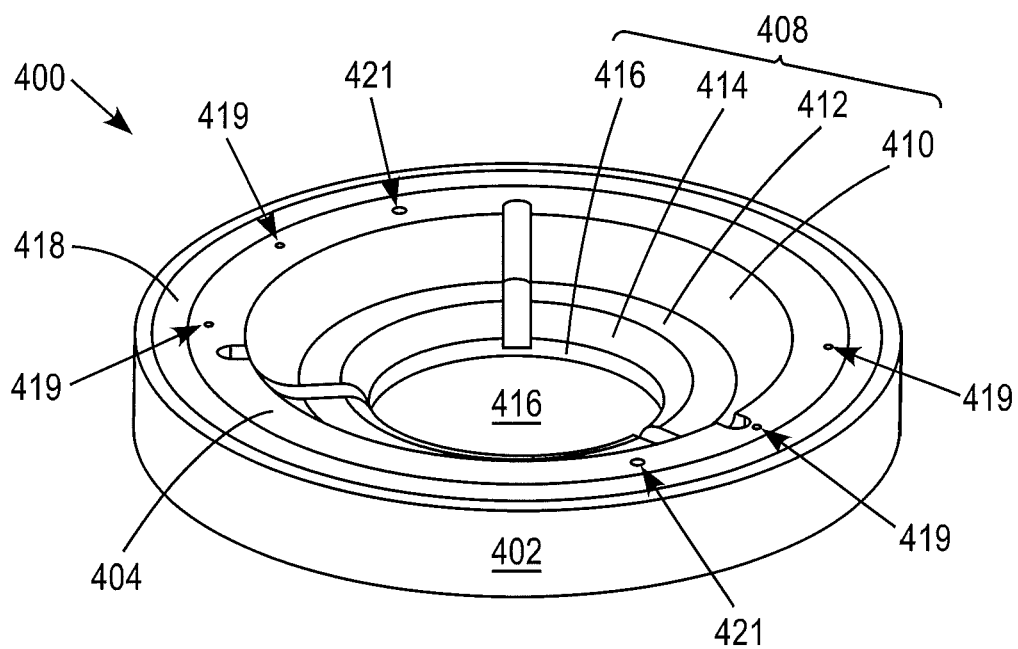
FIG. 6A is a perspective top view of the mid filler shown in FIG. 3
Figure 6B:
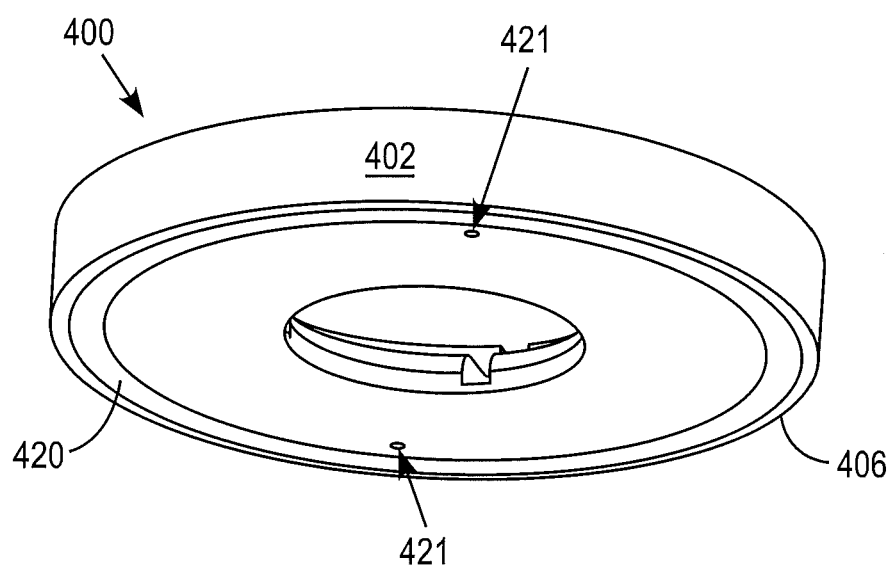
FIG. 6B is a perspective bottom view of the mid filler.
Figure 7A:
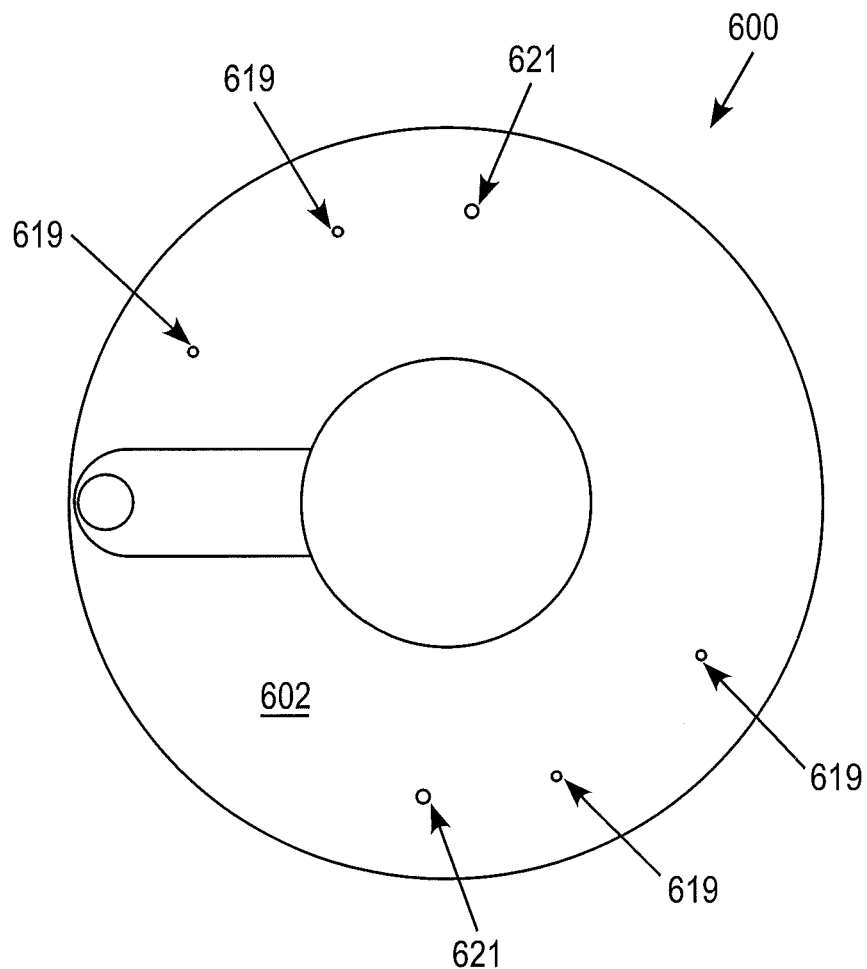
FIG. 7A is a top view of the bottom filler shown in FIG. 3
Figure 7B:
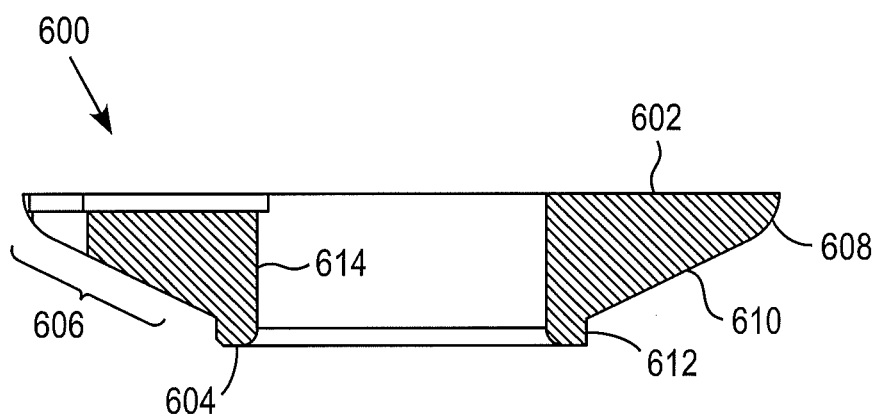
FIG. 7B is a cross-section of the bottom filler.

FIG. 3 is a perspective side view of three chamber fillers in mating engagement wherein a bottom filler 600 supports a mid filler 400 and the mid filler 400 supports a top filler 500. FIG. 4 shows the chamber fillers removably mounted in a chamber 302. Perspective views of the top filler 500, the mid filler 400 and the bottom filler 600 are shown in FIGS. 5A-B, 6A-B and 7A-B, respectively.

The top filler 500 has a cylindrical outer wall 502 of uniform diameter and a frustoconical inner wall 504 which is more narrow at the top and wider at the bottom. A rectangular side opening 506 sized to receive the horizontal support arm of a cantilever chuck extends between outer wall 502 and inner wall 504. The inner wall 504 extends from a horizontally planar upper end 508 to a horizontally planar lower end 510. When used in a chamber for processing 300 mm wafers, the top filler 500 has a height of about 5 inches, an opening 512 at the top of the inner wall 504 has a diameter of about 17.5 inches, an opening 514 at the bottom of the inner wall has a diameter of about 15 inches, the outer wall 502 is cylindrical and has a diameter of about 21 inches, the upper end 508 has a width of about 1.7 inches, the lower end 510 has a width of about 3 inches, and the side opening 506 is rectangular with a height of about 4.4 inches and a width of about 5.5 inches Preferably, the upper end 508 of the top filler 500 is a continuous annular surface, the side opening 506 is defined by a horizontally planar surface 516 and a pair of vertically extending surfaces 518, the pair of vertically extending surfaces 518 forming a gap 520 in the lower end 510 of the top filler 500. The frustoconical inner wall 504 of the top filler 500 is configured to provide an annular gap 522 of at least 1 inch between the frustoconical inner wall 504 and an outer periphery of the cantilever chuck. Preferably, the frustoconical inner wall 504 of the top filler 500 is inclined with respect to the upper end 508 at an angle of about 70 to 80°. To facilitate insertion and removal of the top filler 500 in a chamber, four threaded holes 519 for attachment of a lifting tool are provided in upper end 508 and to allow alignment with the mid filler, two alignment holes 521 for receiving alignment pins are provided in lower end 510.

The mid filler 400 includes a cylindrical outer wall 402 with uniform diameter, a horizontally planar upper end 404, a horizontally planar lower end 406, and an inner wall 408 which includes an upper concave section 410, a horizontal section 412 extending inwardly from a lower end of the concave section 410, a convex section 414 extending downwardly from an inner end of the horizontal section 412 and a cylindrical section 416 of uniform diameter extending downwardly from a lower end of the convex section 414. When used in a chamber for processing 300 mm wafers, the mid filler 400 has a height of about 3 inches, the outer wall 402 has a uniform diameter of about 21 inches, an opening 422 formed by cylindrical section 416 has a diameter of about 8 inches, the upper end 404 has an inner diameter of about 15 inches, the lower end 406 has an inner diameter of about 8 inches, the concave section 410 has a radius of about 1.5 inches, and the convex section 414 has a radius of about 0.75 inch.

To provide proper vertical alignment of the chamber fillers, the mid filler 400 preferably has an upper annular boss 418 on the upper end 404 and a lower annular boss 420 on the lower end 406. The upper annular boss 418 and the lower annular boss 420 are machined to have a high degree of parallelism to each other with a width of about 1 inch and height of about 0.05 inch. The upper annular boss 418 is adapted to contact and support the top filler 500 and the lower annular boss 420 is adapted to contact and be supported on the bottom filler 300. To facilitate insertion and removal of the mid filler 400 in a chamber, four threaded holes 419 for attachment of a lifting tool are provided in upper end 404 and to allow alignment with the top and bottom fillers, two alignment holes 421 for receiving alignment pins are provided in lower end 406 and two alignment holes 421 are provided in upper end 404.

The lower chamber filler 600 includes a horizontally planar upper end 602, a horizontally planar lower end 604, an outer wall 606 which includes a convex section 608 extending downwardly from the upper end 602, a frustoconical section 610 extending downwardly from a lower end of the convex section 608, and a cylindrical section 612 of uniform diameter extending downwardly from the lower end of the frustoconical section 610, and a cylindrical inner wall 614 of uniform diameter except at the bottom where it is flared outwardly. To facilitate insertion and removal of the bottom filler 600 in a chamber, four threaded holes 619 for attachment of a lifting tool are provided in upper end 602 and to allow alignment with the mid filler, two alignment holes 621 for receiving alignment pins are provided in upper end 602.

When used in a chamber for processing 300 mm wafers, the bottom filler 600 preferably has a height of about 4 inches, the outer diameter of the upper end 602 is about 21 inches, the cylindrical section 612 has a uniform diameter of about 10 inches, the height of the cylindrical section 612 is about 0.5 inch, the inner wall 614 has a uniform diameter of about 8 inches except at the bottom where it is flared outwardly with a radius of about 1 inch, the convex section 608 has a radius of about 3 inches, and the frustoconical section 610 is inclined at an angle of about 20 to 30° with respect to the upper end 602.

When the assembly of the top filler 500, mid filler 400 and bottom filler 600 is mounted in a chamber for processing 300 mm wafers, the vertical distance between the upper end 508 and the lower end 604 is about 12 inches. The inner wall 504 of top filler 500 preferably is inclined at about the same angle as the outer surface of a substrate support on which a wafer is supported to provide the annular gap 522 (except where the horizontal support arm of the cantilever chuck is located) between inner wall 504 and the outer surface of the chuck of about 1.4 to 1.5 inches. Preferably the horizontally extending surface 412 of mid filler 400 is spaced from the bottom surface of the chuck by a vertical gap 524 at least equal to the size of the annular gap 522. By choosing different sets of chamber fillers, the inner surfaces of the top filler, mid filler and bottom filler define a preselected lower chamber volume tailored to a particular process to be carried out in the chamber.

During processing of wafers, it may be desirable to change the chamber volume to allow for fast gas switching and/or change gas flow conductance. With the chamber fillers 500, 400, 600 it is possible to modify the inner volume of a standard plasma chamber by inserting chamber fillers with different inner dimensions. By using chamber fillers with different inner dimensions and the same outer dimensions of the outer surfaces 502, 492, 606, 610, 612, a standard sized chamber can be modified to increase or decrease chamber volume by inserting larger or smaller chamber fillers. To increase chamber volume, the dimensions of the inner walls 504, 408 and/or 614 would be modified to increase the annular gap 522 between the inner wall 504 and the chuck and increase the vertical gap 524 between the horizontal surface 412 and the bottom of the chuck. To decrease chamber volume, the dimensions of the inner walls 504, 408 and/or 614 would be modified to decrease the annular gap 522 between the inner wall 504 and the chuck and decrease the vertical gap 524 between the horizontal surface 412 and the bottom of the substrate support. Thus, if fast gas switching is desired, chamber volume can be minimized without changing the optimum gap between the window and the wafer.

The chamber fillers can be made of any suitable chamber material. For example, the fillers can be made of metals such as aluminum or anodized aluminum, ceramics such as aluminum oxide, polymers such as LEXAN (a polycarbonate available from GE Plastics, Pittsfield, Mass.), TEFLON (polytetrafluoroethylene available from DuPont, Wilmington, Del.), VESPEL (a polyimide available from DuPont, Wilmington, Del.), or the like. If desired, the chamber fillers can be coated with materials such as plasma sprayed yttria or alumina. Further, anodized and/or coated surfaces can be sealed with suitable sealants.

Many rapid alternating processes for high aspect ratio features in silicon require considerable changes of pressure between passivating and etching phases. Most rapid alternating processes require throttle valve movement between 50 and 250 counts in less than 300 milliseconds, and current vacuum systems are not capable of covering this required range. As an example, it may be desirable to move a throttle valve from a maximum of 255 counts to a minimum position of 90 counts in under 300 milliseconds. However, with a pendulum throttle valve it may only be possible to move the valve from a maximum of 235 counts to a minimum position of 90 counts in 340 milliseconds (425 counts/second).

In a method of processing a semiconductor in an inductively coupled plasma processing chamber, the semiconductor substrate can be placed on the chuck, and the processing can include adjusting chamber pressure to a higher pressure by while supplying a first processing gas to the chamber and energizing the first gas into a first plasma. The chamber pressure can be adjusted to a lower pressure while supplying a second gas to the chamber and energizing the second gas into a second plasma. Without the chamber fillers, the chamber volume is over 60 liters, e.g., 80 to 100 liters, but with the chamber fillers the chamber volume can be reduced to under 60 liters.

The plasma processing apparatus can be used to etch silicon on a semiconductor substrate supported on a substrate support at a rate of at least 10 µm/min and the plasma processing apparatus can alternately supply etch gas and deposition gas in a plasma confinement zone (chamber gap) in the processing chamber within about 500 milliseconds. In one embodiment, the etching gas is a fluorine containing gas such as $SF_6$ and the deposition gas is a fluorocarbon containing gas such as $C_4F_8$.

In operation, the gas supply system preferably does not divert the etching gas to a vacuum line during supply of the deposition gas to the chamber and does not divert the deposition gas to a vacuum line during supply of the etching gas to the chamber. Processing of a substrate using the plasma processing apparatus described above preferably comprises (a) supporting the substrate in the chamber, (b) supplying the etching gas to the chamber, (c) energizing the etching gas in the chamber into a first plasma and processing the substrate with the first plasma, (d) supplying the deposition gas to the chamber, (e) energizing the deposition gas in the chamber into a second plasma and processing the substrate with the second plasma, (f) repeating steps (b)-(e) with a total cycle time of no greater than 1.8 seconds. The etching gas preferably replaces at least 90% of the deposition gas within a period of about 500 milliseconds in step (b), and the deposition gas preferably replaces at least 90% of the etching gas within a period of about 500 milliseconds (d). During the process, pressure in the chamber is varied from a first pressure setting to a second pressure setting during steps (b)-(e). During a cycle of supplying the etching gas and deposition gas, a total time of supplying the etching gas can be 1.5 seconds or less and a total time of supplying the deposition gas can be 1 second or less. For example, using $SF_6$ as the etch gas and $C_4F_8$ as the deposition gas, pressure can be maintained above 150 mTorr in step (c) and below 140 mTorr in step (e).

Chamber pressure can be rapidly adjusted by maintaining a higher chamber pressure during step (c) and maintaining a lower chamber pressure during step (e). Thus, it is possible to maintain pressure in the chamber during supply of the etching gas greater than 70 mTorr (e.g., 80 mTorr) or greater than 150 mTorr (e.g., 180 mTorr) and pressure in the chamber during supply of the deposition gas less than 140 mTorr (e.g., 120 mTorr) or less than 60 mTorr (e.g., 50 mTorr). In a preferred process, the etching gas is supplied to the chamber at a flow rate of at least 500 sccm and the deposition gas is supplied to the chamber at a flow rate of less than 500 sccm. The alternate steps of supplying etching gas and deposition gas can be carried out for at least 100 cycles.

During the supply of the etching gas the substrate can be subjected to plasma etching of high aspect ratio openings with pressure in the chamber maintained at less than 150 mTorr for 200 milliseconds during a polymer clearing phase of the etching step and at over 150 mTorr for the remainder of the plasma etching step. During the supply of the deposition gas the second plasma can deposit a polymer coating on sidewalls of the openings with pressure in the chamber maintained at less than 150 mTorr for the entire deposition step. The etching gas can be one or more of $SF_6$, $CF_4$, $XeF_2$, $NF_3$, Cl containing gas such as $CCl_4$ and the deposition gas can be a fluorocarbon containing gas such as one or more of $C_4F_8$, $C_4F_6$, $CH_2F_2$, $C_3F_6$, $CH_3F$. The etching gas can be supplied through any suitable gas delivery system including fast acting valves wherein fast acting solenoid valves upon receiving a signal from a controller send pneumatic air to a fast switching valves within 10 milliseconds and total time to open or close the fast switching valves can be 30 milliseconds or less.

Having disclosed the exemplary embodiments and the best mode, modifications and variations may be made to the disclosed embodiments while remaining within the subject and spirit of the invention as defined by the following claims.

What is claimed is:

1. A chamber filler kit comprising at least one chamber filler configured to be replaceably mounted in an inductively coupled plasma chamber having a vacuum outlet in a bottom wall and a cantilever chuck supported on a sidewall of the chamber, the at least one chamber filler is configured to provide a preselected lower chamber volume and conductance enabling a particular process to be carried out in the plasma chamber, the at least one chamber filler including a horizontally extending side opening which fits around a horizontal arm of the cantilever chuck and an inner frustoconical surface which is separated from an outer surface of the chuck by a clearance gap; wherein the at least one chamber filler has an outer wall configured to fit against a wall of the chamber; wherein the at least one chamber filler includes:
   a top filler having an outer wall configured to fit against the sidewall of the chamber, a frustoconical inner wall, the side opening extending from the inner wall to the outer wall, a horizontally planar upper end, and a horizontally planar lower end;
   a mid filler having an outer wall configured to fit against the sidewall of the chamber, an inner wall comprising a horizontally planar annular section extending between an upper concave section and a lower convex section, a horizontally planar upper end and a horizontally planar lower end, the upper end of the mid filler having the same cross section as the lower end of the top filler such that the inner surface of the mid filler mates with the inner surface of the top filler and the outer wall of the mid filler mates with the outer wall of the top filler;
   a bottom filler having an outer wall configured to fit against a bottom wall of the chamber, a cylindrical inner wall, a horizontally planar upper end and a horizontally planar lower end, the upper end of the bottom filler having the same cross section as the lower end of the mid filler such that the inner wall of the bottom filler mates with the inner wall of the mid filler and the outer wall of the bottom filler mates with the outer wall of the mid filler.

2. The chamber filler kit of claim 1, wherein the upper end of the top filler is a continuous annular surface, the side opening is defined by a horizontally planar surface and a pair of vertically extending surfaces, the pair of vertically extending surfaces forming a gap in the lower end of the top filler, and the frustoconical inner wall of the top filler is configured to provide an open space of at least 1 inch between the frustoconical inner wall and an outer periphery of the cantilever chuck.

3. The chamber filler kit of claim 1, wherein the frustoconical inner wall of the top filler is inclined with respect to the upper end at an angle of about 70 to 80°.

4. The chamber filler kit of claim 1, wherein the upper end of the top filler has a width of about 1.7 inches, the outer wall of the top filler is cylindrical and has a uniform diameter of about 21 inches and height of about 5 inches, the lower end of the top filler has a width of about 3 inches, the side opening is rectangular with a height of about 4.4 inches and a width of about 5.5 inches.

5. The chamber filler kit of claim 1, wherein the mid filler has an upper annular boss on the upper end and a lower annular boss on the lower end thereof, the upper annular boss and the lower annular boss being parallel to each other, having a width of about 1 inch and height of about 0.05 inch, the upper annular boss adapted to contact and support the top filler and the lower annular boss adapted to contact and be supported on the bottom filler.

6. The chamber filler kit of claim 1, wherein the mid filler has a height of about 3 inches, the upper end of the mid filler has an inner diameter of about 15 inches, the lower end of the mid filler has an inner diameter of about 8 inches, the outer wall of the mid filler has a uniform diameter of about 21 inches, the concave section has a radius of about 1.5 inches, the convex section has a radius of about 0.75 inch.

7. The chamber filler kit of claim 1, wherein the bottom filler has a height of about 4 inches, the upper end of the bottom filler has an outer diameter of about 21 inches and an inner diameter of about 8 inches, the inner wall of the bottom filler has a uniform diameter of about 8 inches except at a lower end thereof where it is flared outwardly with a radius of about 1 inch, the outer wall of the bottom filler has an upper convex section connected to a lower cylindrical section by a frustoconical section wherein the convex section has a radius of about 3 inches, the frustoconical section is inclined at an angle of about 20 to 30° with respect to the horizontal upper end of the bottom filler, and the lower cylindrical section has an outer diameter of about 10 inches.

8. The chamber filler kit of claim 1, wherein the at least one chamber filler comprises a plurality of chamber fillers which are configured to fit in a plasma chamber having a chamber volume of about 90 to 100 liters and reduce the chamber volume to about 20 to about 60 liters.

9. The chamber filler kit of claim 1, wherein the upper ends of the top filler, the mid filler and the bottom filler have mounting holes therein adapted to cooperate with a lifting tool used to insert and remove the chamber fillers from a plasma chamber.

10. An inductively coupled plasma chamber comprising a chamber having a cantilever chuck extending inwardly from a sidewall of the chamber, a dielectric window forming a top wall of the chamber, a radio frequency (RF) energy source which inductively couples RF energy into the chamber through the window, a process gas source supplying process gas into the chamber, a vacuum outlet in a bottom wall of the chamber and the chamber filler kit of claim 1 mounted in the chamber such that a support arm of the cantilever chuck extends through the side opening in the at least one chamber filler.

11. The chamber of claim 10, wherein the the outer wall of the top filler is against the sidewall of the chamber, the inner wall of the top filler is inclined such that an upper end of the inner wall is wider than a lower end of the inner wall, the upper end of the top filler is located below an upper surface of the chuck, the mid filler supports the top filler and the bottom filler supports the mid filler so as to provide an annular gap between the inner wall of the top filler and a periphery of the chuck and a vertical gap between a horizontal surface of the mid filler and a bottom surface of the chuck, and the bottom filler having an opening at a lower end thereof in communication with the vacuum outlet.

* * * * *